(12) United States Patent
Lin et al.

(10) Patent No.: US 12,148,671 B2
(45) Date of Patent: *Nov. 19, 2024

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Shih-Yao Lin, Hsinchu (TW); Chao-Cheng Chen, Hsinchu (TW); Chih-Han Lin, Hsinchu (TW); Chen-Ping Chen, Hsinchu (TW); Ming-Ching Chang, Hsinchu (TW); Chia-Hao Yu, Hsinchu (TW); Hsiao Wen Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/446,943

(22) Filed: Aug. 9, 2023

(65) Prior Publication Data

US 2024/0014073 A1  Jan. 11, 2024

Related U.S. Application Data

(63) Continuation of application No. 17/376,960, filed on Jul. 15, 2021, now Pat. No. 11,854,899.

(51) Int. Cl.
*H01L 21/8234* (2006.01)
*H01L 21/311* (2006.01)
(Continued)

(52) U.S. Cl.
CPC ............... *H01L 21/823431* (2013.01); *H01L 21/31144* (2013.01); *H01L 21/823418* (2013.01); *H01L 27/0886* (2013.01); *H01L 29/0665* (2013.01); *H01L 29/41775* (2013.01); *H01L 29/42392* (2013.01); *H01L 29/66545* (2013.01); *H01L 29/66553* (2013.01); *H01L 29/78696* (2013.01)

(58) Field of Classification Search
CPC ....... H01L 21/31144; H01L 21/823418; H01L 21/823425; H01L 21/823431; H01L 21/823481; H01L 21/823814; H01L 21/823821; H01L 27/088; H01L 27/0886; H01L 29/0665; H01L 29/41775; H01L 29/42376; H01L 29/42392; H01L 29/66439; H01L 29/66545; H01L 29/66553; H01L 29/78696
See application file for complete search history.

(56) References Cited

U.S. PATENT DOCUMENTS

2017/0221893 A1  8/2017  Tak et al.

*Primary Examiner* — Cheung Lee
(74) *Attorney, Agent, or Firm* — FOLEY & LARDNER LLP

(57) ABSTRACT

A method of fabricating a semiconductor device is described. A plurality of fins is formed over a substrate. Dummy gates are formed patterned over the fins, each dummy gate having a spacer on sidewalls of the patterned dummy gates. Recesses are formed in the fins using the patterned dummy gates as a mask. A passivation layer is formed over the fins and in the recesses in the fins. The passivation layer is patterned to leave a remaining passivation layer only in some of the recesses in the fins. Source and drain regions are epitaxially formed only in the recesses in the fins without the remaining passivation layer.

20 Claims, 27 Drawing Sheets

(51) Int. Cl.
*H01L 27/088* (2006.01)
*H01L 29/06* (2006.01)
*H01L 29/417* (2006.01)
*H01L 29/423* (2006.01)
*H01L 29/66* (2006.01)
*H01L 29/786* (2006.01)

SEMICONDUCTOR DEVICES AND METHODS OF MANUFACTURING THEREOF

CROSS-REFERENCE TO RELATED APPLICATIONS

The present application is a Continuation of Ser. No. 17/376,960, filed Jul. 15, 2021, the entire disclosure of which is incorporated herein by reference.

BACKGROUND

This disclosure relates generally to a semiconductor device, and in some embodiments, to transistor devices that include providing a channel cut through passivation.

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

Fin field-effect Transistor (FinFET) devices are becoming commonly used in integrated circuits. FinFET devices have a three-dimensional structure that comprises a fin protruding from a substrate. A gate structure, configured to control the flow of charge carriers within a conductive channel of the FinFET device, wraps around the fin. For example, in a FinFET device, the gate structure wraps around three sides of the fin, thereby forming conductive channels on three sides of the fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
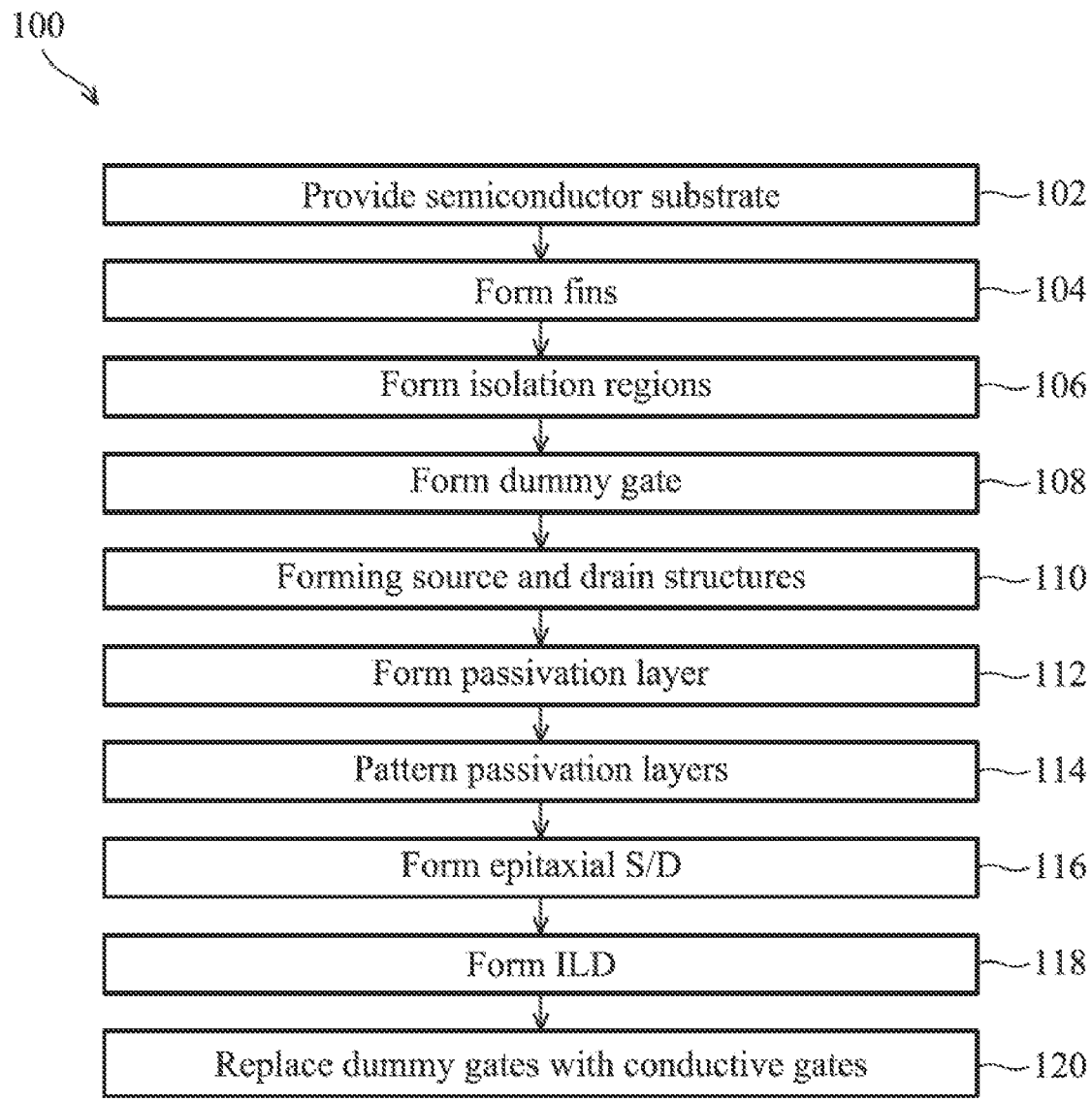
FIG. 1 illustrates a flow chart of an example method to make a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In contemporary semiconductor device fabrication processes, a large number of semiconductor devices, such as field effect transistors ("FETs"), are fabricated on a single wafer. Non-planar transistor device architectures, such as fin-based transistors (typically referred to as "FinFETs"), can provide increased device density and increased performance over planar transistors. Some advanced non-planar transistor device architectures, such as nanostructure transistor like nanosheet/nanowire transistors, can further increase the performance over the FinFETs. When compared to the FinFET where the channel is partially wrapped (e.g., straddled) by a gate structure, the nanosheet transistor, in general, includes a gate structure that wraps around the full perimeter of one or more nanosheets for improved control of channel current flow. For example, in a FinFET and a nanosheet transistor with similar dimensions, the nanosheet transistor can present larger driving current (Ion), smaller subthreshold leakage current ($I_{off}$), etc. Such a transistor that has a gate structure fully wrapping around its channel is typically referred to as a gate-all-around (GAA) transistor of GAAFET.

The present disclosure provides various embodiments of a semiconductor device, which may include a FinFET, GAAFET, or nanosheet FET (NSFET) transistor.

Embodiments of the present disclosure are discussed in the context of forming a non-planar transistor, such as a FinFET, GAAFET, or NSFET transistor, and in particular, in the context of forming a semiconductor device where a channel cut process is performed using passivation to select which fins will not have any source/drain (S/D) formed adjacent the fins. In some embodiments, a plurality of fins are formed over a substrate. Subsequently, dummy gates patterned over the fins are formed, each dummy gate having a spacer on sidewalls of the patterned dummy gates. Recesses are formed in the fins using the patterned dummy gates as a mask. A passivation layer is formed over the fins and in the openings in the fins. The passivation layer is patterned to leave a remaining passivation only in some of the recesses in the fins. Source and drain regions are epitaxially formed only in the recesses in the fins without remaining passivation.

A semiconductor device formed by the above described method according can advantageously address processing issues arising from performing channel cut before dummy gate formation. A channel cut early in the processing results in different channel-to-channel spacing due to the cut, which may result in an iso-dense loading effect in some device manufacturing processing steps, such as shallow trench isolation (STI), and dummy gate formation. Early channel cut processing further may result in defects at the channel cut, such as from CD control, overlay control, or profile control. According to some embodiments, the early channel cut process is replaced with patterning a passivation layer to selectively prevent the S/D epitaxy process at selected of the channels, and thereby isolating the selected channels after dummy gate patterning. Thus, early channel cut problems, such as iso-dense loading, may be prevented, and device yield may be improved.

FIG. 1 illustrates a flowchart of a method 100 to form a non-planar transistor device, according to one or more embodiments of the present disclosure. For example, at least some of the operations (or steps) of the method 100 can be used to form a GAA (or a FinFET) transistor device such as, for example, a nanosheet transistor device, a nanowire transistor device, a vertical transistor device, or the like. Further, the method 100 can be used to form a GAA transistor (or FinFET transistor) device in a respective conduction type such as, for example, an n-type GAA transistor device or a p-type GAA transistor device. The term "n-type," as used herein, may be referred to as the conduction type of a transistor having electrons as its conduction carriers, and the term "p-type," as used herein, may be referred to as the conduction type of a transistor having holes as its conduction carriers.

FIG. 1 illustrates a flowchart of a method 100 to form a semiconductor device according to one or more embodiments of the present disclosure. It is noted that the method 100 is merely an example, and is not intended to limit the present disclosure. In some embodiments, the semiconductor device includes, at least part of, a fin field-effect-transistor (FinFET), but can include any of various other transistors (e.g., a GAAFET, a nanosheet field-effect-transistor) while remaining within the scope of the present disclosure.

Referring to FIG. 1, the method 100 starts with operation 102 in which a semiconductor substrate is provided. The method 100 continues to operation 104 in which one or more fins are formed extending beyond a major surface of the semiconductor substrate. The method 100 continues to operation 106 in which an isolation dielectric is formed in the fins. The method 100 continues to operation 108 in which a dummy gate and sidewalls are formed. The method 100 continues to operation 110 in which S/D (source/drain) epitaxial area recesses are formed in the fins. The method 100 continues to operation 112 in which a passivation layer is formed. The method 100 continues to operation 114 in which the passivation layer is patterned leaving a remaining passivation only in some of the epitaxial area recesses. The method 100 continues to operation 116 in which S/D structures are epitaxially formed only in those epitaxial area recesses without remaining passivation. The method 100 continues to operation 118 in which an interlevel dielectric (ILD) is formed. The method 100 continues to operation 120 in which the dummy gates are removed and replaced with conducting gates.

In the following discussions, the operations of the method 100 may be associated with views of a semiconductor device 200 at various fabrication stages. In some embodiments, the semiconductor device 200 may be a FinFET. In other embodiments the semiconductor device 200 may be a GAAFET or nanosheet FET (NSFET).

Figure 2A:
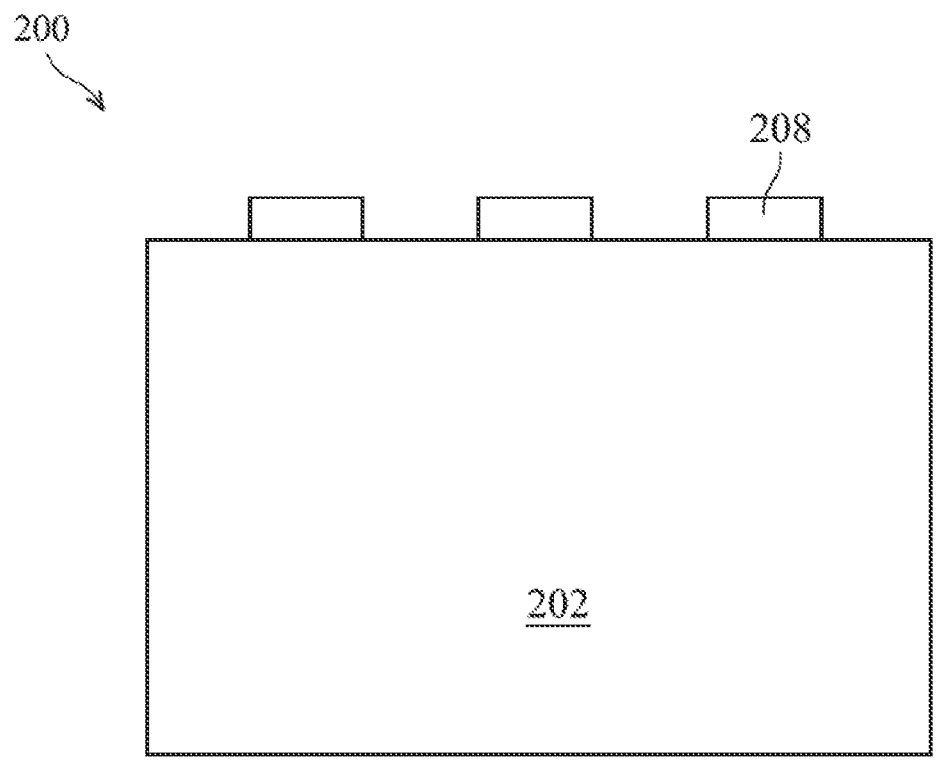
FIGS. 2A, 3A, 4, 5A, 6A, 7A, 8A, 9A, 10A, and 11A, illustrate cross-sectional views cut along a direction without the gate (Y-Y direction in perspective view of FIG. 16) of a semiconductor device, made by the method of FIG. 1, during various fabrication stages in accordance with some embodiments.

Corresponding to operation 102 of FIG. 1, FIG. 2A is a view of the semiconductor device 200 including a substrate 202 at one of the various stages of fabrication, according to some embodiments. In some embodiments, the substrate 202 is covered by a photo-sensitive layer 208 is patterned to subsequently form one or more fins of the semiconductor device, which will be discussed in the following operations.

For a FinFET structure, the substrate 202 may be a semiconductor substrate, such as a bulk semiconductor, a semiconductor-on-insulator (SOI) substrate, or the like, which may be doped (e.g., with a p-type or an n-type dopant) or undoped. The substrate 202 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 202 may include silicon;

germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 2B:
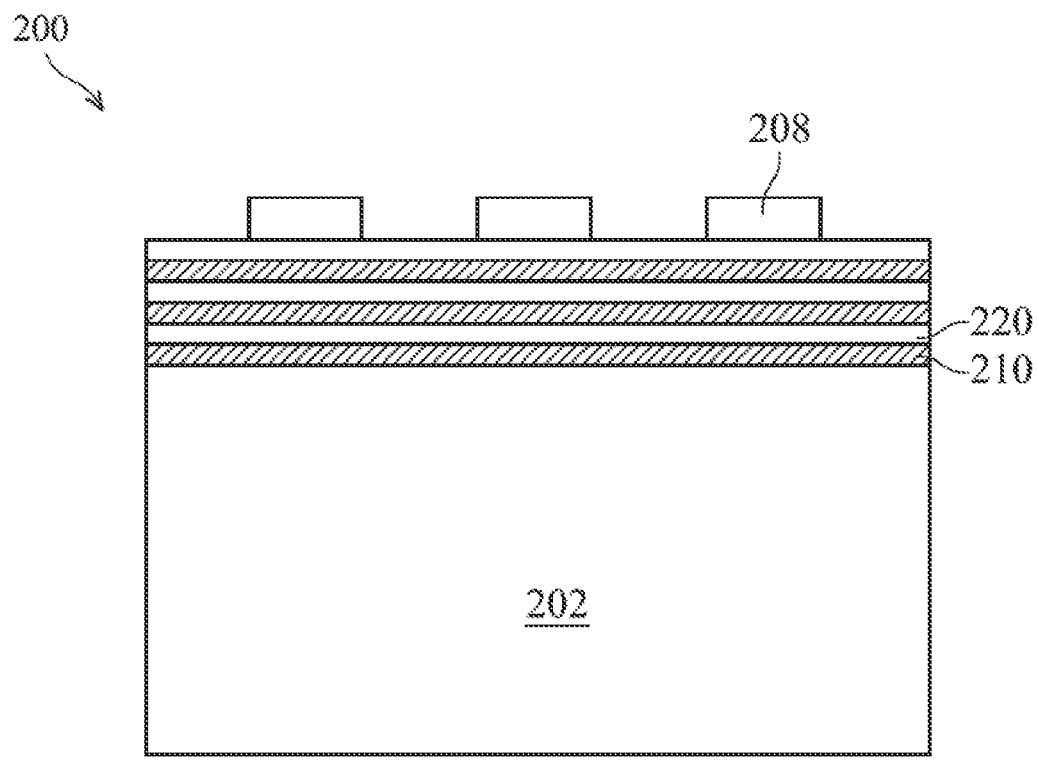
FIGS. 2B and 3B, illustrate cross-sectional views cut along a direction without the gate (Y-Y direction in perspective view of FIG. 17) of a semiconductor device, made by the method of FIG. 1, during various fabrication stages in accordance with some embodiments, where the device may be a GAAFET.

FIG. 2A illustrates a substrate 202 for a FinFET semiconductor device. Alternative, the semiconductor device may be a GAAFET or NSFET where the substrate 202 is overlaid by semiconductor sub-layers alternating with a sacrificial layer as shown in FIG. 2B. Specifically, the overlay stack may include first semiconductor layers 210 (sacrificial layer) and second semiconductor layers 220 alternatingly disposed on top of one another (e.g., along the Z direction) to form a stack. For example, one of the second semiconductor layers 210 is disposed over one of the first semiconductor layers 210 then another one of the first semiconductor layers 210 is disposed over the second semiconductor layer 220, so on and so forth.

The stack may include any number of alternately disposed semiconductor layers 210 and 220. The semiconductor layers 210 and 220 may have different thicknesses. The first semiconductor layers 210 may have different thicknesses from one layer to another layer. The second semiconductor layers 220 may have different thicknesses from one layer to another layer. The thickness of each of the semiconductor layers 210 and 220 may range from a few nanometers to a few tens of nanometers. The first layer of the stack may be thicker than other semiconductor layers 210 and 220. In an embodiment, each of the first semiconductor layers 210 has a thickness ranging from about 5 nanometers (nm) to about 20 nm, and each of the second semiconductor layers 220 has a thickness ranging from about 5 nm to about 20 nm.

The two semiconductor layers 210 and 220 have different compositions. In various embodiments, the two semiconductor layers 210 and 220 have compositions that provide for different oxidation rates and/or different etch selectivity between the layers. In an embodiment, the semiconductor layers 210 include silicon germanium ($Si_{1-x}Ge_x$), and the semiconductor layers 220 include silicon (Si). In an embodiment, each of the semiconductor layers 220 is silicon that may be undoped or substantially dopant-free (i.e., having an extrinsic dopant concentration from about 0 $cm^{-3}$ to about $1 \times 10^{17}$ $cm^{-3}$), where for example, no intentional doping is performed when forming the layers 220 (e.g., of silicon).

In various embodiments, the semiconductor layers 220 may be doped (e.g., with a p-type or an n-type dopant) or undoped. For example, when the semiconductor device 200 is a GAAFET configured in n-type (and operates in an enhancement mode), each of the semiconductor layers 220 may be silicon that is doped with a p-type dopant such as boron (B), aluminum (Al), indium (In), and gallium (Ga); and when the semiconductor device 200 is a GAAFET configured in p-type (and operates in an enhancement mode), each of the semiconductor layers 220 may be silicon that is doped with an n-type dopant such as phosphorus (P), arsenic (As), antimony (Sb). In another example, when the semiconductor device 200 is a GAAFET configured in n-type (and operates in a depletion mode), each of the semiconductor layers 220 may be silicon that is doped with an n-type dopant instead; and when the semiconductor device 200 is a GAAFET configured in p-type (and operates in a depletion mode), each of the semiconductor layers 220 may be silicon that is doped with a p-type dopant instead. In some embodiments, each of the semiconductor layers 210 is $Si_{1-x}Ge_x$ that includes less than 50% (x<0.5) Ge in molar ratio. For example, Ge may comprise about 15% to 35% of the semiconductor layers 210 of $Si_{1-x}Ge_x$ in molar ratio.

Furthermore, the first semiconductor layers 210 may include different compositions among them, and the second semiconductor layers 220 may include different compositions among them.

Either of the semiconductor layers 210 and 220 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 210 and 220 may be chosen based on providing differing etch selectivity.

The semiconductor layers 210 and 220 can be epitaxially grown from the semiconductor substrate 202. For example, each of the semiconductor layers 210 and 220 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 202 extends upwardly, resulting in the semiconductor layers 210 and 220 having the same crystal orientation with the semiconductor substrate 202.

Figure 3A:
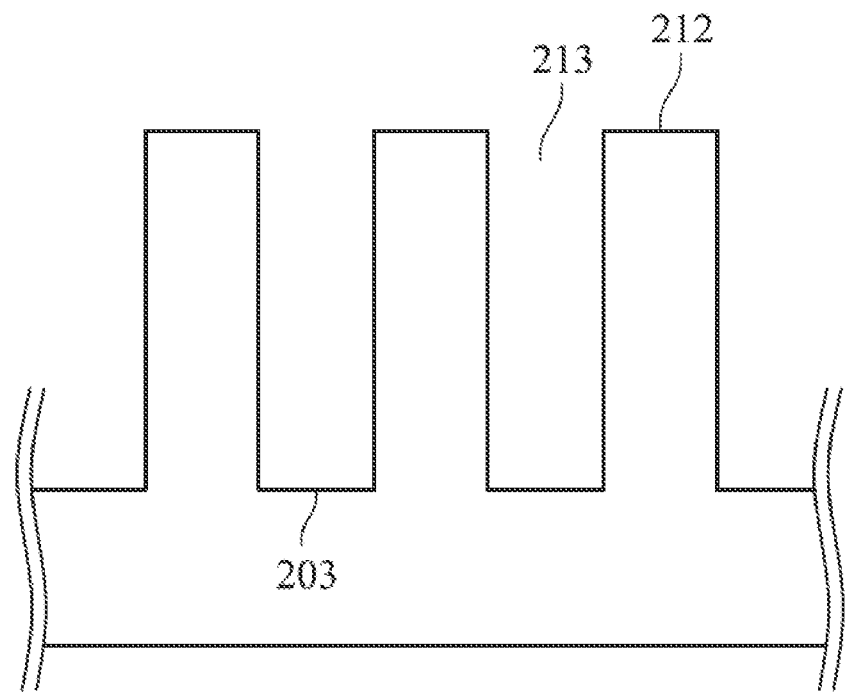

Corresponding to operation 104 of FIG. 1, FIG. 3A is a view of the semiconductor 200 including at least a fin 212 at one of the various stages of fabrication, according to some embodiments. As shown, the fin 212 is sandwiched between trenches 213. It is noted that although three fins 212 are shown in the illustrated embodiments of FIG. 3A (and the following figures), any desired number of fins may be formed on the semiconductor substrate 202 using the photosensitive layer 208 (FIG. 2A) with a corresponding pattern. As such, when multiple fins are formed on the substrate 202 that are in parallel with one another, the fins can be spaced apart from one another by a corresponding trench 213.

The fins 212 may be formed by a photolithographic process, for example. The photo-sensitive layer 208 may be patterned in a photolithographic process, for example, and used as an etch mask to etch the substrate 202 to form fins 212 and trenches 213 between the fins 212, in the substrate 202. Portions of the semiconductor substrate 202 sandwiched between the trenches 213 are thus formed as fins 212. The fins 212 each extend upward from the surface 203. The trenches 213 may be strips (viewed from the top of the semiconductor device 200) parallel to each other, and closely spaced with respect to each other. After the fins 212 are formed, the photo-sensitive layer 208 (not shown in FIG. 3A for purposes of clarity) is removed. Subsequently, a cleaning process may be performed to remove a native oxide of the semiconductor substrate 202. The cleaning may be performed using diluted hydrofluoric (DHF) acid, or the like, for example.

Figure 3B:
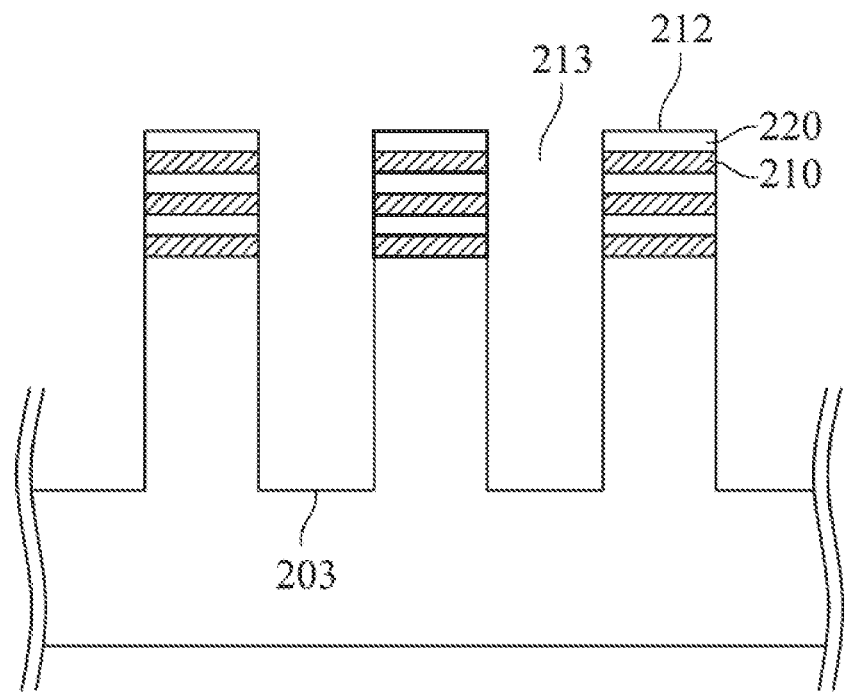

FIG. 3B illustrates an embodiment where the semiconductor device 200 is a GAAFET or NSFET, where the fins 212 include the overlay stack of FIG. 2B, and where the fins 212 may include the first semiconductor layers 210 (sacrificial layer) and second semiconductor layers 220.

Figure 4:
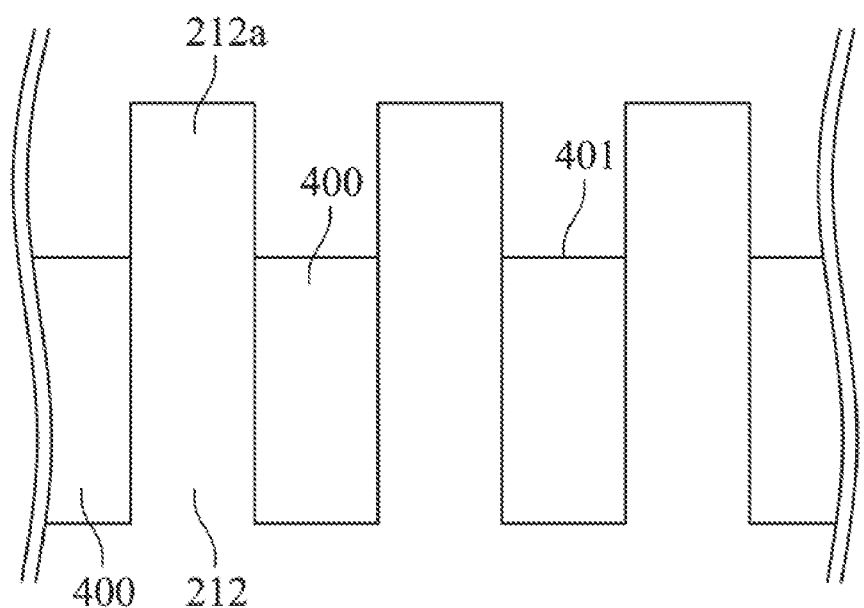

Corresponding to operation 106 of FIG. 1, FIG. 4 is a view of the semiconductor 200 including isolation regions 400 at one of the various stages of fabrication, according to some embodiments. The isolation regions 400, which are formed of an insulation material, such as an isolation dielectric, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 400 and a top surface of the fins 212 that are coplanar (not shown).

In some embodiments, the isolation regions 400 include a liner, e.g., a liner oxide (not shown), at the interface between each of the isolation regions 400 and the substrate 202 (fins 212). In some embodiments, the liner oxide is formed to reduce crystalline defects at the interface between the substrate 202 and the isolation region 400. Similarly, the liner oxide may also be used to reduce crystalline defects at the interface between the fins 212 and the isolation region 400. The liner oxide (e.g., silicon oxide) may be a thermal oxide formed through a thermal oxidation of a surface layer of the substrate 202, although other suitable methods may also be used to form the liner oxide.

Next, the isolation regions 400 are recessed to form shallow trench isolation (STI) regions 400, as shown in FIG. 4. The isolation regions 400 are recessed such that the upper portion of the fins 212 (hereinafter "fin 212A") protrude from between neighboring STI regions 400. In other words, the fins 212A are protruded from a top surface 401 of the STI regions 400. The top surface 401 of the STI regions 400 may have a flat surface (as illustrated), a convex surface, a concave surface (such as dishing), or combinations thereof. The top surface 401 of the STI regions 400 may be formed flat, convex, and/or concave by an appropriate etch. The isolation regions 400 may be recessed using an acceptable etching process, such as one that is selective to the material of the isolation regions 400. For example, a dry etch or a wet etch using dilute hydrofluoric (DHF) acid may be performed to recess the isolation regions 400.

Figure 5A:
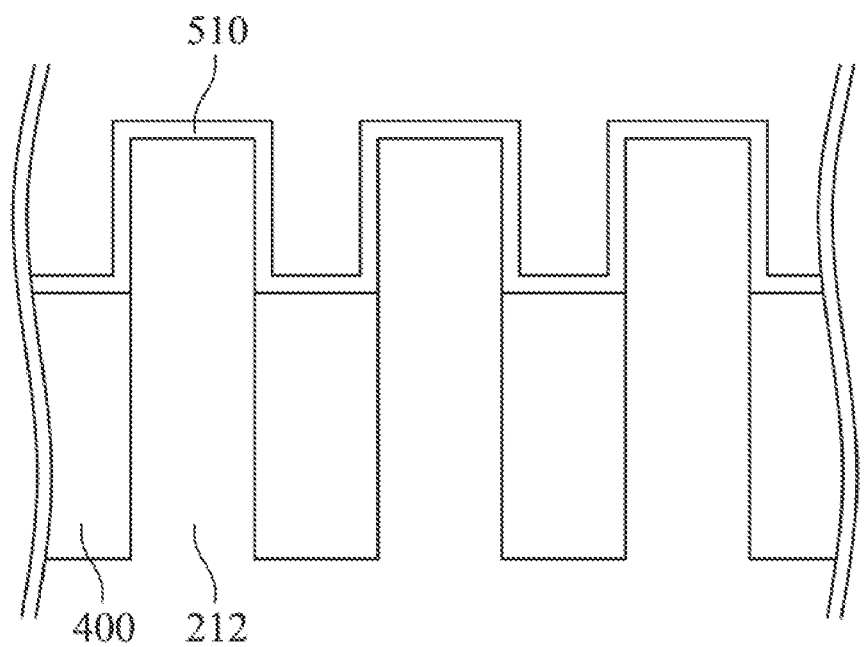
Figure 5B:
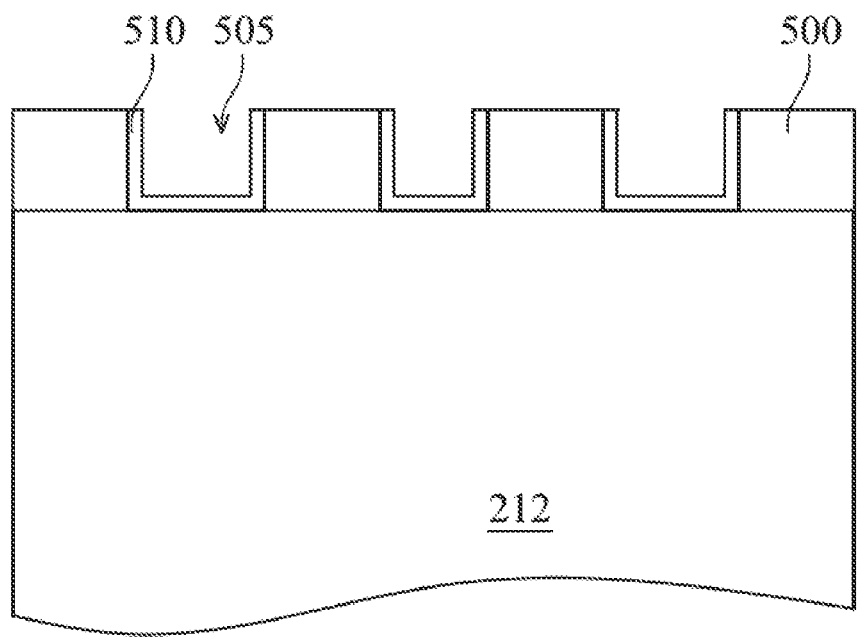
FIGS. 5B, 6B, 7B, 8B, 9B, 10B, and 11B, illustrate cross-sectional views cut along a direction (X-X direction in FIG. 16) with the channel, and corresponding respectively, to FIGS. 5A, 6A, 7A, 8A, 9A, 10A, and 11A in accordance with some embodiments.

Corresponding to the operation 108 of FIG. 1, FIGS. 5A and 5B illustrate views of the semiconductor device 200 including a dummy gate structure 500 and spacer 510 at one of the various stages of fabrication, according to some embodiments, where FIG. is a cross-sectional view of the semiconductor 200 taken along a cross section including multiple fins 212, and 5B is a cross-sectional view of the semiconductor 200 taken along a cross section along one of the fins 212.

The dummy gate structure 500 may be formed from a gate layer formed over the fins 212 and then planarized, such as by a CMP. A mask layer may be deposited over the gate layer. The gate layer may be formed of, for example, polysilicon, although other materials may also be used. The mask layer may be formed of, for example, silicon nitride or the like. After the layers (e.g., the gate layer, and the mask layer) are formed, the mask layer may be patterned using acceptable photolithography and etching techniques to form a mask. The pattern of the mask then may be transferred to the gate layer by an acceptable etching technique to form the dummy gate structure 500. The patterned dummy gate structure 500 has one or more recesses 505 therein exposing each of the fins 212.

The spacer 510 may then be formed on the sidewalls of the recesses 505 and contacting exposed regions of the fins 212. The spacer material may be an insulator, for example, such as SiOCN, SiCN, SiON, SiN, or SiO. The spacer 510 may be formed by one or more sub-layers, for example.

Figure 6A:
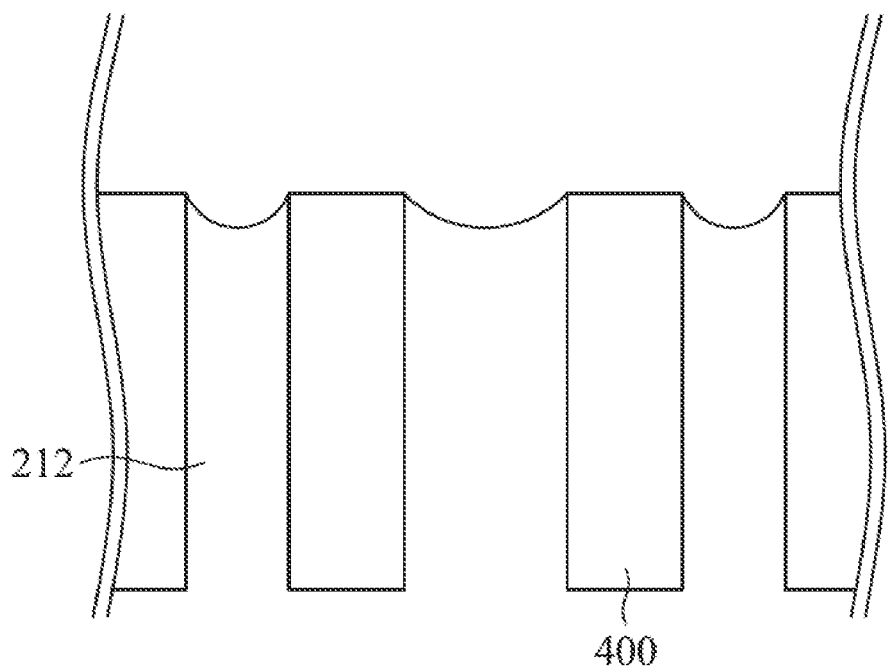
Figure 6B:
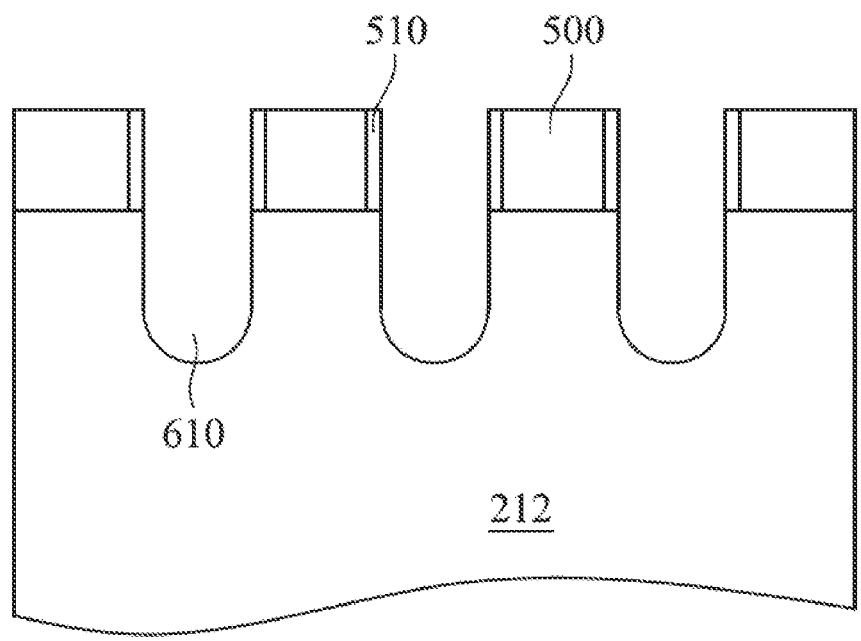

Corresponding to the operation 110 of FIG. 1, FIGS. 6A and 6B are views of the semiconductor device 200 where S/D epitaxial area recesses 610 are formed in the fins 212. In this process the patterned dummy gate structure 500 may be used as an etch mask in etching the S/D epitaxial area recesses 610 in the fins 212. At least a lower portion of the spacer 510 in the recesses 505 of the patterned dummy gate structure 500 may be removed so that surface of the fins 212 may be exposed to etchant. In particular, the portion of the spacer 510 near the fins 212 may be removed. The portion of the spacer 510 near the sidewall of the fins 212 may likewise be removed. On the other hand, the portion of the spacer 510 near the patterned dummy gate structure 500 may not be entirely removed, and the portion of the spacer 510 near the isolation regions 400 may or may not be entirely removed.

Further portions of the spacer 510 which contact the fins 212, but are not covered by the dummy gate structure 500 may be removed in a planarization or etch back process which removes an upper portion of the fins 212 above the dielectric isolation 400.

Figure 7A:
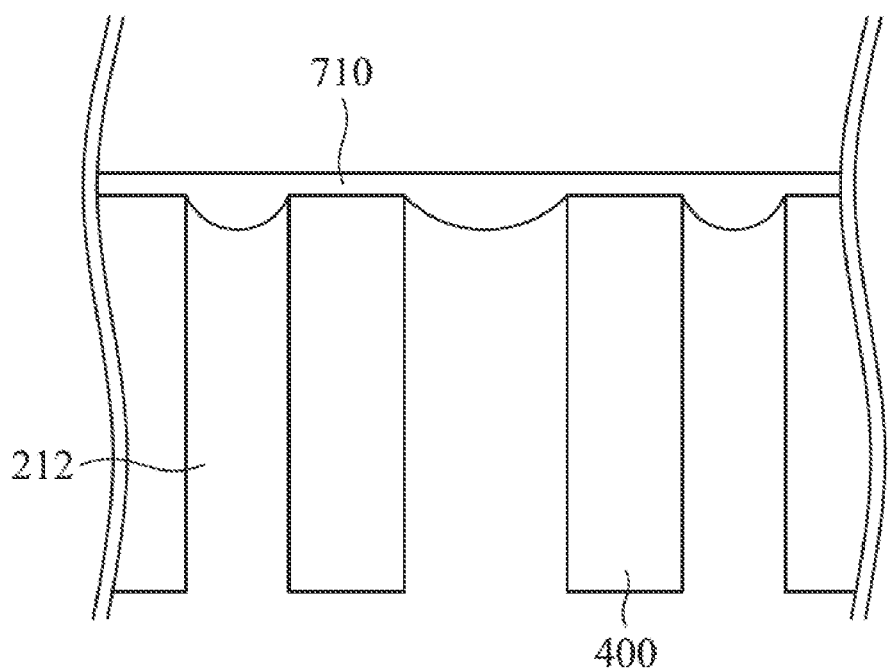
Figure 7B:
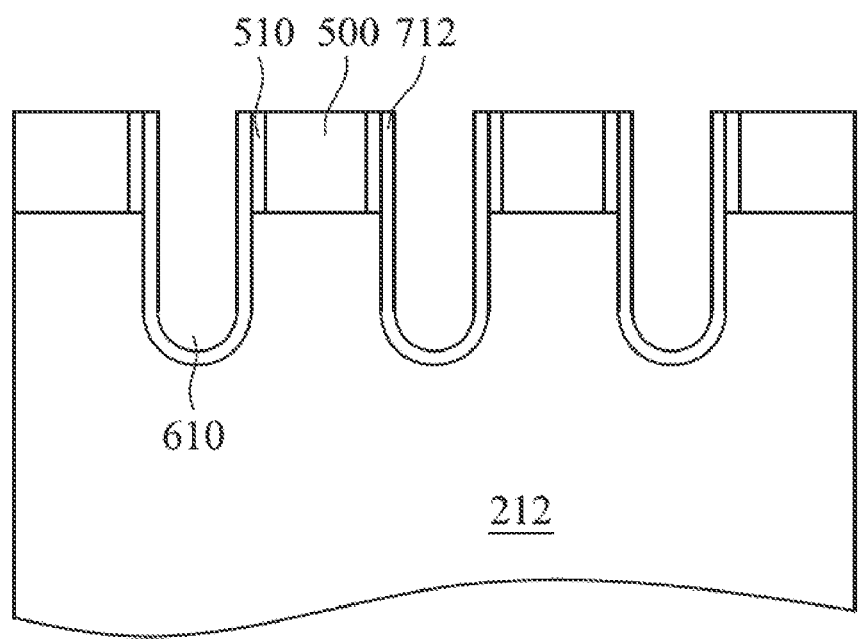

Corresponding to the operation 112 of FIG. 1, FIGS. 7A and 7B are views of the semiconductor device 200, a passivation layer 710 is formed. The passivation layer 710 may be blanket deposited. The passivation 710 may be formed on the exposed upper surfaces of the fins 212, in the recesses 505, and the S/D epitaxial area recesses 610.

The particular composition of the passivation layer is not limited, however, the passivation layer may be resistant to epitaxial growth on the material of the source and drain regions. The passivation layer 710 may include, for example, a material selected from the group consisting of SiN, SiON, SiCN, SiOCN, $SiO_2$, SiC, HfO, $Al_2O_3$, Co, W and combinations thereof. The passivation layer 710 may be formed by any one of CVD, PVD, PECVD, ALD or PEALD, for example.

The passivation layer 710 may include a number of sub-layers, where the number of sub-layers may be, for example, between 1 and 10 sub-layers. The thickness of each sub-layer may be, for example, in the range of 0.3 nm to 30 nm.

Figure 8A:
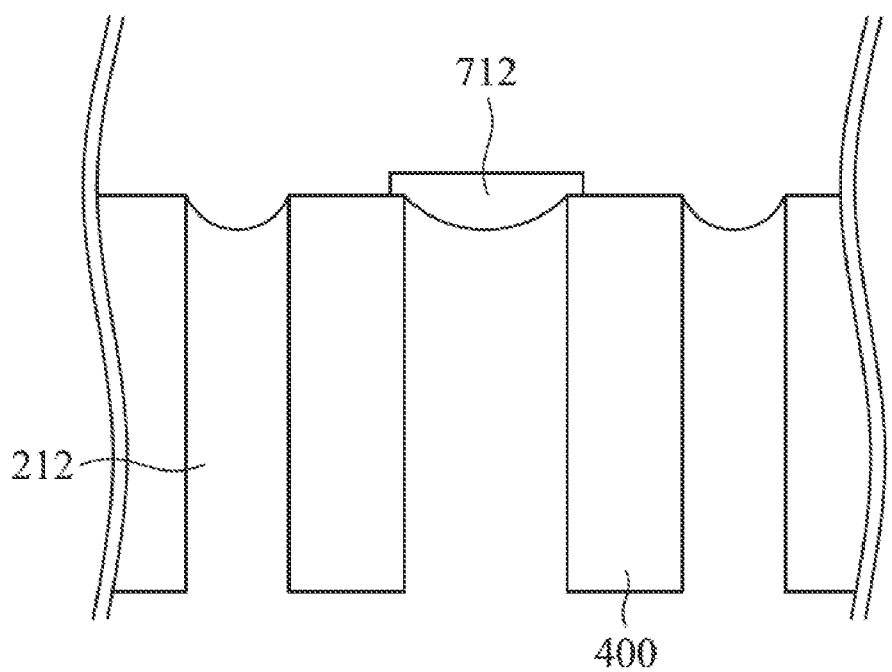
Figure 8B:
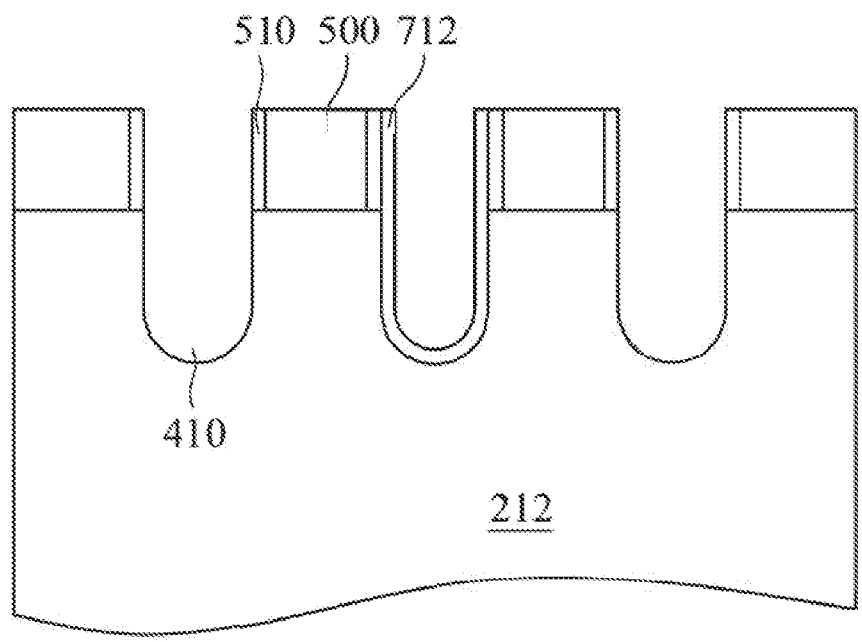

Corresponding to the operation 114 of FIG. 1, FIGS. 8A and 8B are views of the semiconductor device 200 where the passivation layer 710 is patterned. The passivation layer 710 may be patterned to leave a remaining passivation 712 covering only in some openings which expose the fins 212. For example, the remaining passivation 712 may cover only some of the S/D epitaxial area openings 610. In this way a subsequent epitaxial process to form S/D regions will form S/D regions only in regions where there is no remaining passivation 712. Thus, the S/D regions will be formed only in selected of the S/D epitaxial area recesses 610.

The passivation layer 710 may be patterned by an appropriate method. For example, the passivation layer 710 may be patterned by a photolithographic process using a photoresist, which is exposed to light, and then patterned. The patterned photoresist may then be used as an etch mask to etch the passivation layer 710 leaving the remaining passivation 712.

The main etch gas depends on the material of the passivation layer 710. A Si-based passivation layer may use $Cl_2$/HBr-based main etch gas, while a metal-based passivation layer may use $BCl_3$/$Cl_2$-based main etch gas.

For etch of the passivation layer 710, the dry etch conditions for the passivation layer may include a main etch gas of $Cl_2$, HBr, $CF_4$, $CHF_3$, $CH_2F_2$, $CH_3F$, $C_4F_6$, $BCl_3$, $SF_6$, and/or $H_2$, for example. A passivation gas for tuning etch selectivity may include $N_2$, $O_2$, $CO_2$, $SO_2$, CO, and/or $SiCl_4$. A dilution gas may include at least one of Ar, He, or Ne, for example. The plasma source power may be between 100 W and 3000 W. The plasma bias power may be between 0 W and 3000 W. The pressure may be between 1 mTorr and 800 mTorr. The etch flow rate may be between 1 sccm and 5000 sccm.

For a wet clean etch, the main etch chemical may include at least one of HF, $F_2$, or $H_3PO_4$, for example. An assisted etch chemical for selectivity tuning may include at least one of $O_3$, $H_2SO_4$, HCl, HBr, or $NH_3$. A solvent for the wet etch may include at least one of DI water, alcohol, or acetone.

Figure 9A:
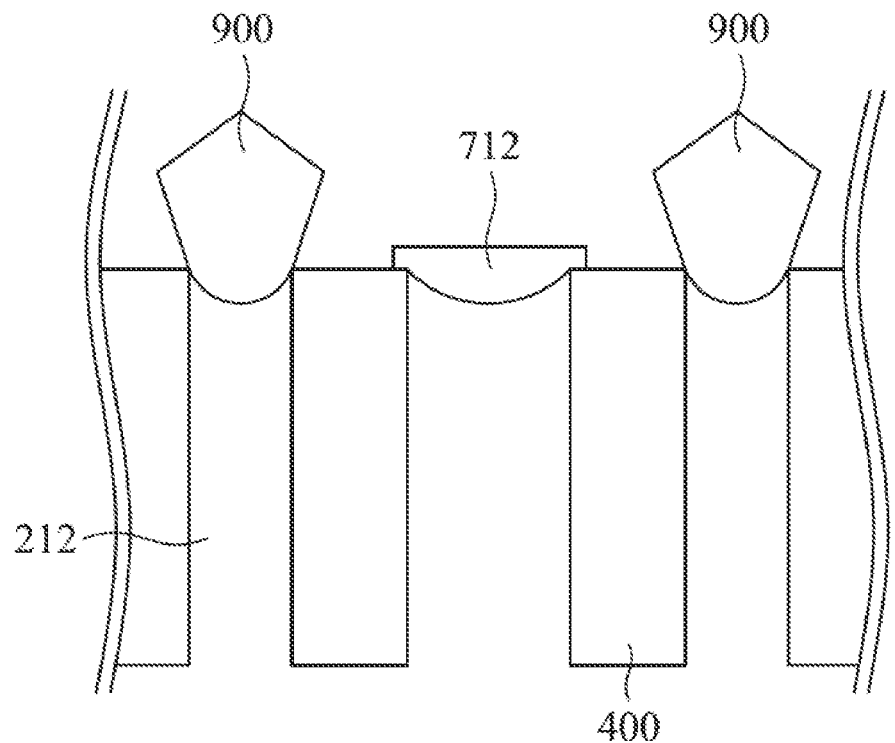
Figure 9B:
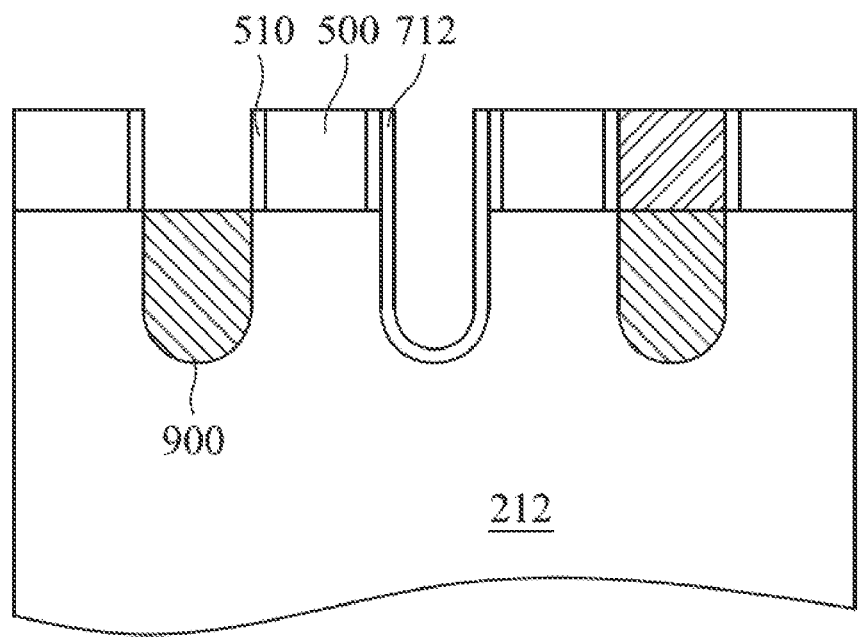

Corresponding to the operation 114 of FIG. 1, FIGS. 9A and 9B are views of the semiconductor device 200 in which S/D structures are epitaxially formed only in those epitaxial area recesses 610 without remaining passivation 712. The remaining passivation 712 may be resistant to epitaxial growth on the material of the source and drain regions.

The S/D structures 900 may be formed from re-exposed regions of the fins 212, which are not covered by the remaining passivation 712. The source/drain regions 900 are formed by epitaxially growing a semiconductor material from the exposed portions of the fins 212. Various suitable methods can be used to epitaxially grow the S/D structures 900 such as, for example, metal-organic CVD (MOCVD), molecular beam epitaxy (MBE), liquid phase epitaxy (LPE), vapor phase epitaxy (VPE), selective epitaxial growth (SEG), the like, or combinations thereof.

In some embodiments, when the resulting semiconductor device 200 is an n-type FinFET, the source/drain structures 900 may include silicon carbide (SiC), silicon phosphorous (SiP), phosphorous-doped silicon carbon (SiCP), or the like. When the resulting FinFET 200 is a p-type FinFET, the source/drain structures 900 may include SiGe, and a p-type impurity such as boron or indium.

The S/D structures 900 may be implanted with dopants to form the source/drain structures 900, followed by an anneal process. The implanting process may include forming and patterning masks such as a photoresist to cover the regions of the FinFET 200 that are to be protected from the implanting process. The S/D structures 900 may have an impurity (e.g., dopant) concentration in a range from about $1\times10^{19}$ $cm^{-3}$ to about $1\times10^{21}$ $cm^{-3}$. P-type impurities, such as boron or indium, may be implanted in the S/D region 900 of a P-type transistor. N-type impurities, such as phosphorous or arsenide, may be implanted in the S/D structures 900 of an N-type transistor. In some embodiments, the epitaxial S/D structures may be in situ doped during growth.

Figure 10A:
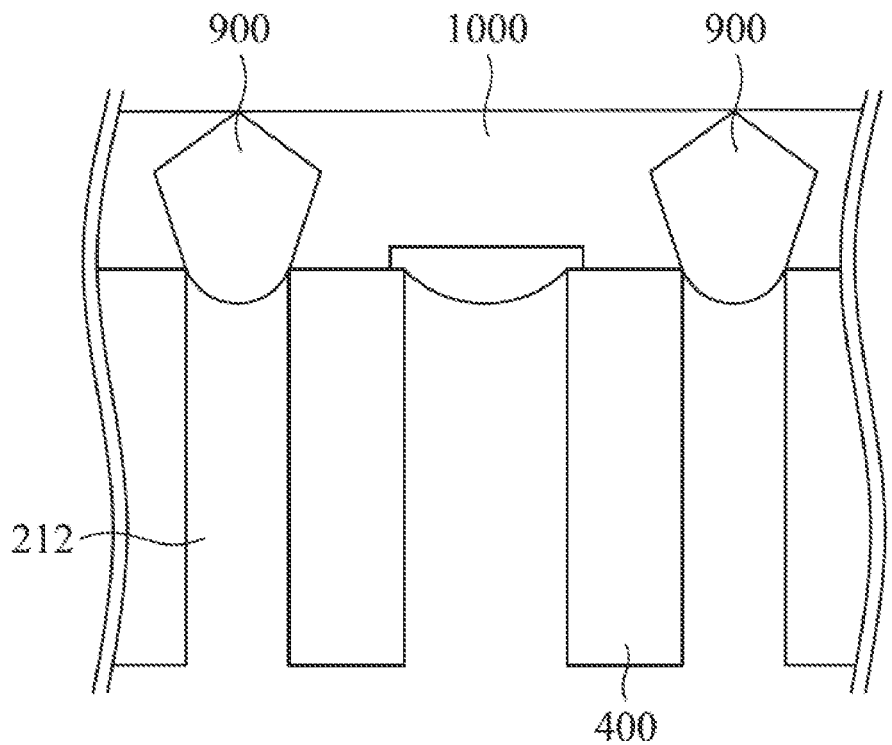
Figure 10B:
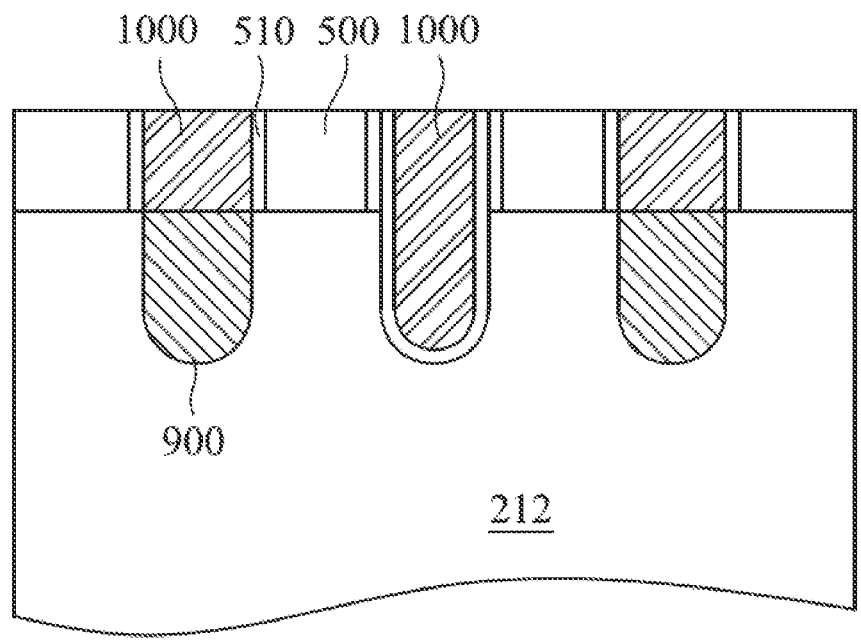

Corresponding to the operation 116 of FIG. 1, FIGS. 10A and 10B are views of the semiconductor device 200 in which an ILD 1000 is at one of the various stages of fabrication, according to some embodiments. As shown, the ILD 1000 is formed over the fins 212 and the S/D structures 900, and is formed in recesses 505 in the dummy gate structure 500. The ILD 1000 may be formed over a contact etch stop layer (CESL) (not shown). In some embodiments, the ILD 1000 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 1000 is formed, a planarization process, such as a CMP process, may be performed to achieve a level upper surface for the ILD 1000. After the planarization process, the upper surface of the ILD 1000 can be level with the upper surface of the dummy gate structure 500, in some embodiments.

Figure 11A:
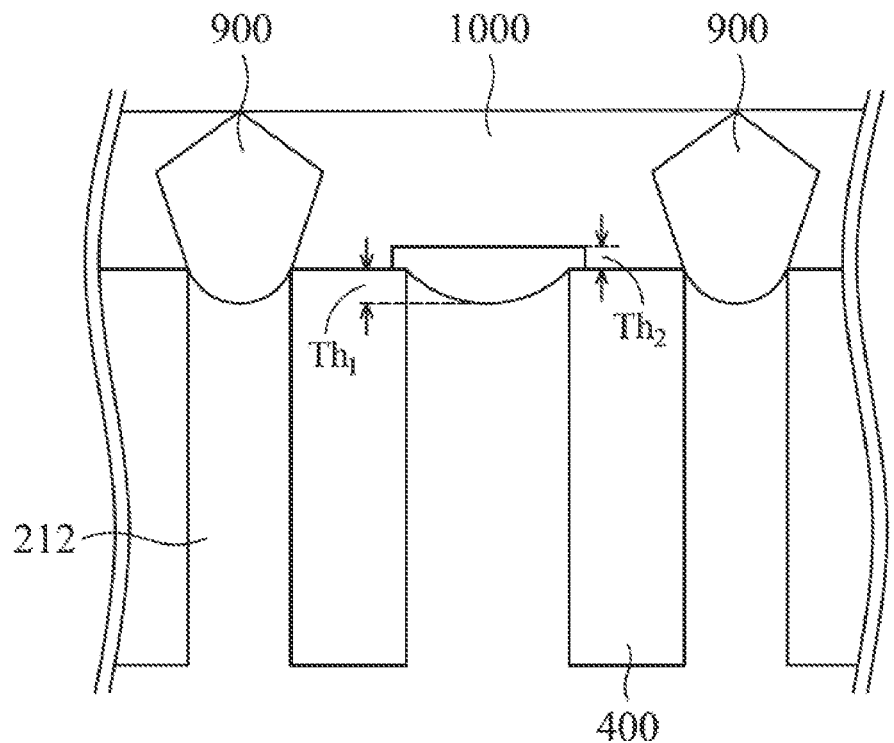
Figure 11:
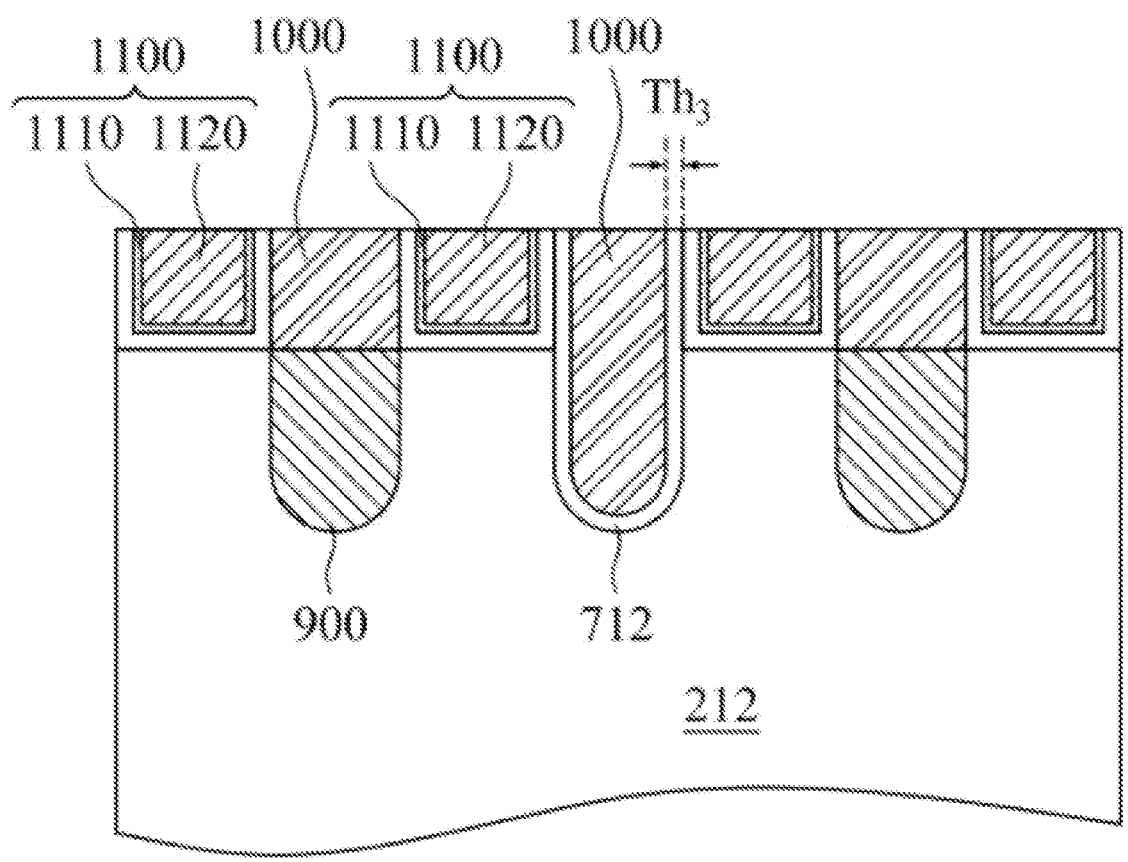

Corresponding to the operation 118 of FIG. 1, FIGS. 11A and 11B are views of the semiconductor device 200 in which the dummy gate structures 500 are removed and replaced with conducting gates 1100 (active gates). The dummy gate structures 500 may be removed, for example, by an appropriate etch. The conducting gates 1100 may include a gate dielectric 1110 and a gate electrode 1120. The central portions of the fin 212 is overlaid by the conductive gate electrode 1120 with the gate dielectric layer 1110 sandwiched therebetween. The gate dielectric layer 1110 may include a high-k dielectric material (e.g., with a k value greater than about 4.0 or even greater than about 7.0). In such embodiments, the high-k dielectric layer 1110 may include a material selected from: $Al_2O_3$, HfAlO, HfAlON, AlZrO, $HfO_2$, $HfSiO_x$, $HfAlO_x$, $HfZrSiO_x$, HfSiON, $LaAlO_3$, $ZrO_2$, or combinations thereof. The high-k dielectric layer 1110 may be formed using a suitable process such as ALD, CVD, PVD, plating, or combinations thereof. The gate electrode 1120 may include a metal material such as, for example, Al, Cu, W, Ti, Ta, TiN, TiAl, TiAlN, TaN, NiSi, CoSi, or combinations thereof. In some other embodiments, the gate electrode 1120 may include a polysilicon material. The polysilicon material may be doped with a uniform or non-uniform doping concentration. The gate electrode 1120 may be formed using a suitable process such as ALD, CVD, PVD, plating, or combinations thereof.

In FIGS. 11A and 11B, the remaining passivation 712 remains on some of the fins 212, namely those fins 212 which have been selected so that there is to be no epitaxial growth. The remaining passivation 712 remains on sidewalls of the recesses 610 of some of the fins 212 with a thickness Th3 of about 0.3 nm to 30 nm, for example, as shown in FIG. 11B. The remaining passivation 712 is formed in a recess at the top of some of the fin structures 212 with a depth Th2 in the recess of about 0.3 nm to 20 nm, for example, as shown in FIG. 11A. The remaining passivation 712 is formed in a recess at the top of some of the fin structures 212 with a thickness Th1 outside of the recess of about 0.3 nm to 30 nm, for example, as shown in FIG. 11A. The thicknesses may also apply for a semiconductor device with a GAAFET structure.

Figure 12:
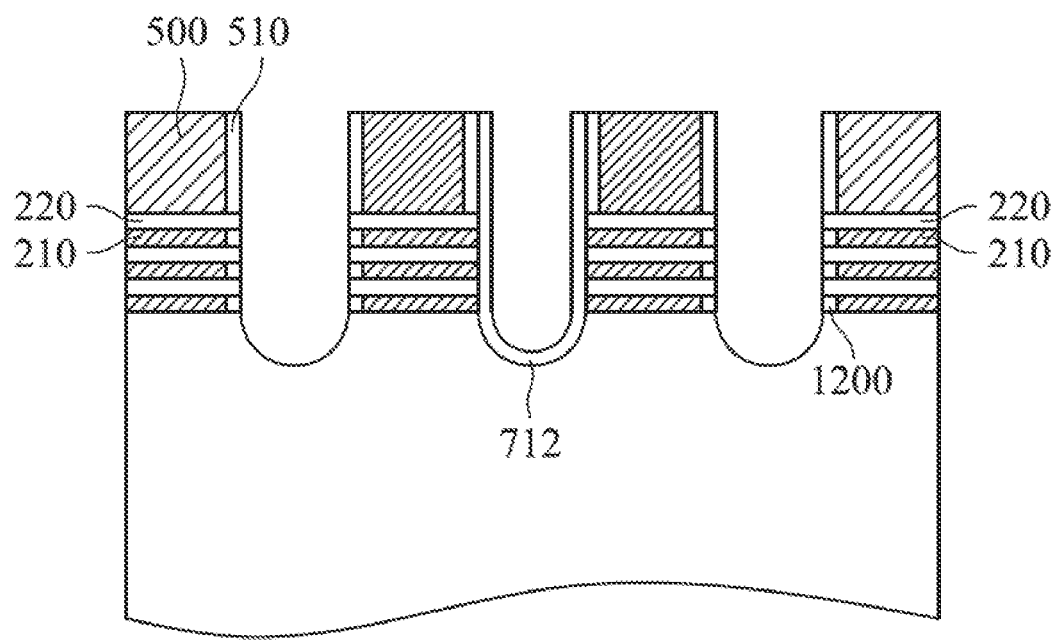
FIG. 12 illustrates cross-sectional views cut along a direction (X-X direction in FIG. 17) with the channel of a semiconductor device, made by the method of FIG. 1, using an inner spacer last process in accordance with some embodiments, where the device may be a GAAFET.

FIG. 12 illustrates inner spacer last processing in the case that the semiconductor device 200 is a GAAFET. The inner spacer 1200 is formed after remaining passivation 712 is formed in FIGS. 8A and 8B. The end portions of the semiconductor layers 210 (sacrificial layer) are recessed (e.g., etched) using a "pull-back" process to pull the semiconductor layers 210 back by an initial pull-back distance such that the ends of the semiconductor layers 210 are laterally recessed with respect to the semiconductor layers 220. It is understood that the pull-back distance (i.e., the extent to which each of the semiconductor layers 210 is etched, or pulled-back) can be arbitrarily increased or decreased. In an example where the semiconductor layers 220 include Si, and the semiconductor layers 210 include $Si_{1-x}Ge_x$, the pull-back process may include a hydrogen chloride (HCl) gas isotropic etch process, which etches SiGe without attacking Si. As such, the semiconductor layers 220 may remain substantially intact during this process.

As shown in the illustrated example of FIG. 12, the etch for the pull-back process for the inner spacer last process does not etch the end portions of the semiconductor layers 210 covered by the remaining passivation 712. As noted above, if the semiconductor layers 220 include Si, and the semiconductor layers 210 include $Si_{1-x}Ge_x$, the pull-back process may include a hydrogen chloride (HCl) gas isotropic etch process, which etches SiGe without attacking Si. The etch selectivity may be controlled during inner spacer 1200 formation with etch rates, where the semiconductor layers 210 etch rate is greater than the remaining passivation 712 etch rate, which in turn is greater than the semiconductor layers 220 etch rate. For example, a dry etch using $NF_3$, $Cl_2$, HBr, either alone or in combination, with a passivation gas $O_2$, $SO_2$, $CO_2$, $SiCl_4$ with a suitable energy may be used. Wet clean with suitable chemistry, such as dilute HF or HCl with DI water may also be used. The semiconductor layers 210 may be partially remaining during inner spacer formation, but may be completely removed in subsequent processing.

As shown in the illustrated example of FIG. 12, the inner spacers 1200 can be formed along the etched ends of each of the semiconductor layers 210 and along respective ends of each of the semiconductor layers 210 and 220. The inner spacers for the inner spacer last process are not formed on the remaining passivation 712.

The inner spacers 1200 can be formed conformally by chemical vapor deposition (CVD), or by monolayer doping (MLD) of nitride followed by spacer RIE. The inner spacers 1200 can be deposited using, e.g., a conformal deposition process and subsequent isotropic or anisotropic etch back to remove excess spacer material on the sidewalls of the fins 212 and on a surface of the semiconductor substrate 202. A material of the inner spacers 1200 can be formed from, for example, silicon nitride, silicoboron carbonitride, silicon carbonitride, silicon carbon oxynitride, or any other type of dielectric material (e.g., a dielectric material having a dielectric constant less than about 5) appropriate to the role of forming an insulating gate sidewall spacers of transistors.

Figure 13:
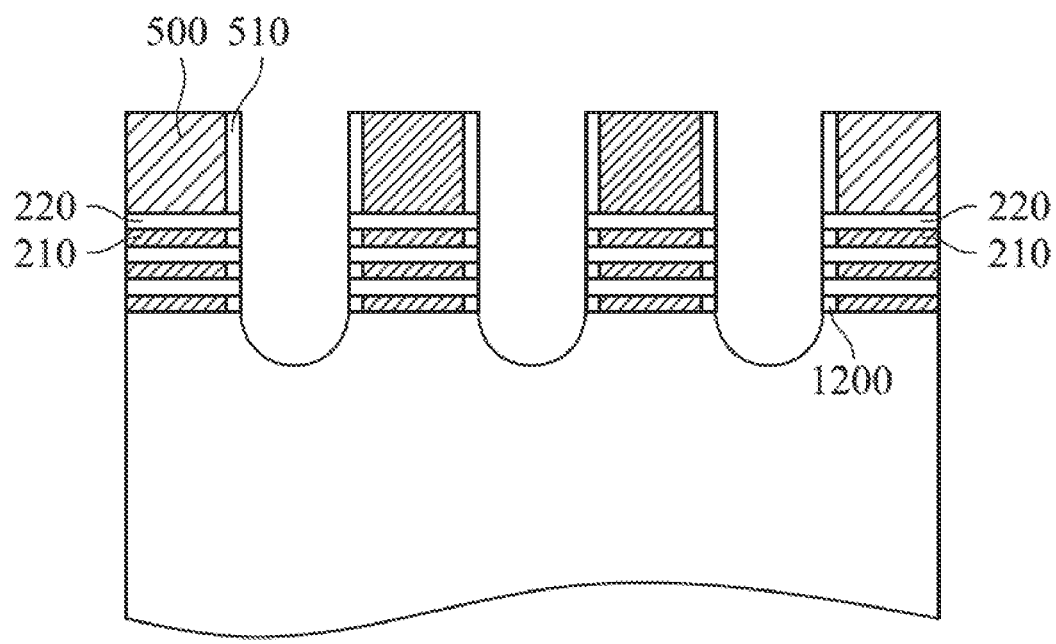
FIG. 13 illustrates cross-sectional views cut along a direction (X-X direction in FIG. 17) with the channel of a semiconductor device, made by the method of FIG. 1, using an inner spacer first process in accordance with some embodiments, where the device may be a GAAFET.

FIG. 13 illustrates inner spacer first processing in the case that the semiconductor device 200 is a GAAFET. In the inner spacer first processing, the inner spacer 1200 is formed before the passivation layer 710 is formed, but is otherwise similar to the inner spacer last process. As shown in the illustrated example of FIG. 13, the inner spacers 1200 can be formed along the etched ends of each of the semiconductor layers 210. In the inner spacing first processing, inner spacers 1200 are formed adjacent each of the S/D epitaxial area recesses 610, in contrast to the inner spacing last processing which has remaining passivation 712 in some of the recesses 610.

Figure 14:
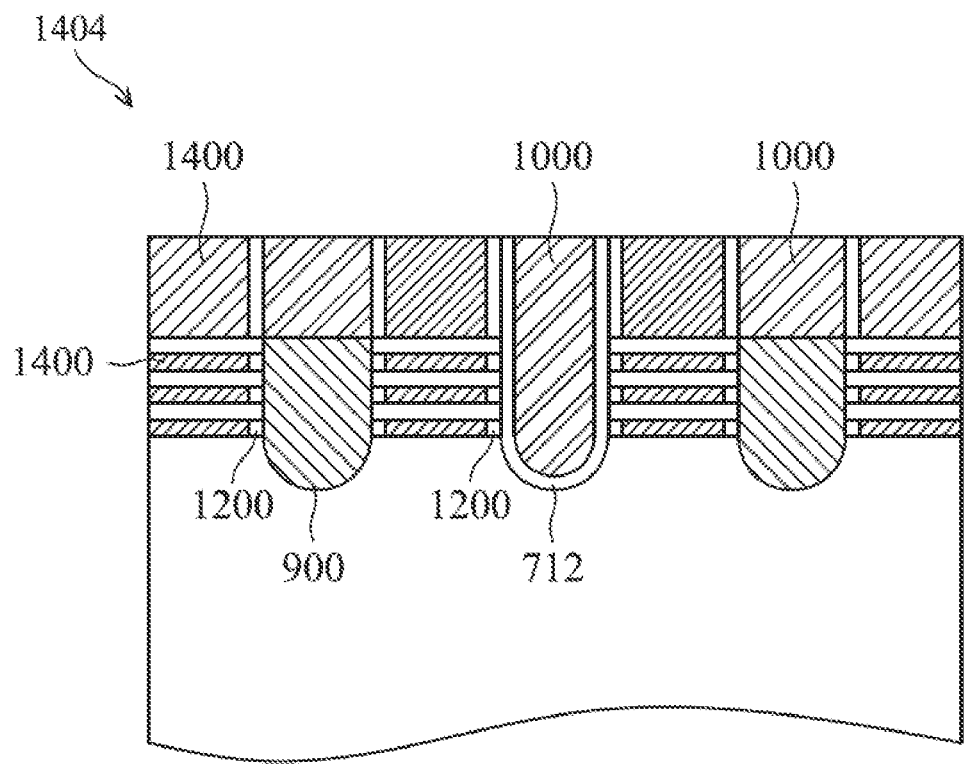
FIG. 14 illustrates cross-sectional views cut along a direction (X-X direction in FIG. 17) with the channel of a semiconductor device, made by the method of FIG. 1, illustrating dummy gate removal and conductive gate formation in accordance with some embodiments, where the device may be a GAAFET.

FIG. 14 illustrates the dummy gate removal and conductive gate formation process in the case that the semiconductor device 200 is a GAAFET. In FIG. 14, the dummy gate structures 500, and the semiconductor layers 210 (sacrificial layer) are sequentially removed at one of the various stages of fabrication. Further, the semiconductor layers 220, which have been vertically separated from one other, are suspended.

The dummy gate structures 500 can be removed by an etching process, e.g., RIE or chemical oxide removal (COR). Next, the semiconductor layers 210 are removed from each of the fin structures 212 by applying a selective etch (e.g., a hydrochloric acid (HCl)), while leaving the semiconductor layers 220 substantially intact. After the removal of the semiconductor layers 210, a respective bottom surface and top surface of each of the semiconductor layers 220 may be exposed.

Once the dummy gate structures 500 are removed and the surfaces of the semiconductor layers 220 are exposed, active gate structures 1400 may be formed in the regions of the removed dummy gate structures 500 and contacting the semiconductor layers 220.

Each of the conductive gate structures 1400 includes a gate dielectric and a gate metal, in some embodiments. For example, each of the active gate structures 1400 includes a gate dielectric (not shown for simplicity) and a gate metal 1404.

The gate dielectric wraps around each of the semiconductor layers 220. The gate dielectric may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric may include a stack of multiple high-k dielectric materials. The gate dielectric can be deposited using any suitable method, including, for example, molecular beam deposition (MBD), atomic layer deposition (ALD), PECVD, and the like. In some embodiments, the gate dielectric may optionally include a substantially thin oxide (e.g., $SiO_x$) layer.

The gate metal 1404 can wrap around each of the semiconductor layers 220 with the gate dielectric disposed therebetween. Specifically, the gate metal 1404 can include a number of gate metal sections abutted to each other along the Z direction. Each of the gate metal sections can extend not only along a horizontal plane (e.g., the plane expanded by the X direction and the Y direction), but also along a vertical direction (e.g., the Z direction). As such, two adjacent ones of the gate metal sections can adjoin together to wrap around a corresponding one of the semiconductor layers 220, with the gate dielectric disposed therebetween.

The gate metal 1404 may include a stack of multiple metal materials. For example, the gate metal 1404 may be a p-type work function layer, an n-type work function layer, multilayers thereof, or combinations thereof. The work function layer may also be referred to as a work function metal. Example p-type work function metals that may include TiN, TaN, Ru, Mo, Al, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process.

Figure 15A:
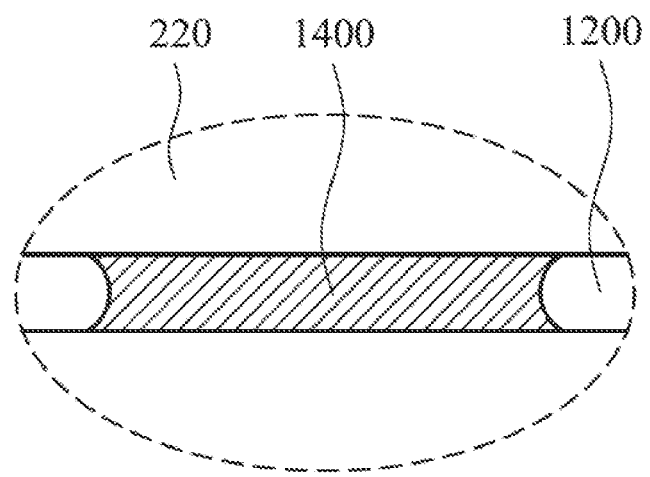
FIGS. 15A and 15B illustrate magnified cross sectional views of a portion of the device of FIG. 14 in a region showing portions of the conductive gate, second semiconductor material (channel), and inner spacer in accordance with some embodiments.
Figure 15B:
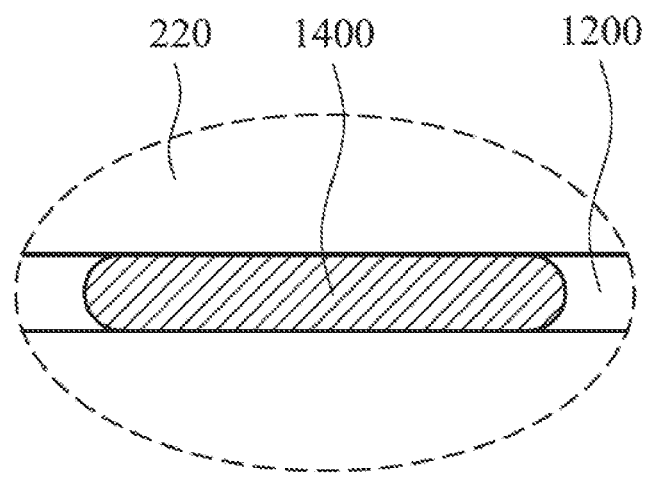

FIGS. 15A and 15B illustrate magnified cross sectional views of a portion of the device 200 of FIG. 14 in a region showing portions of the conductive gate 1400, second semiconductor material 220 (channel), and inner spacer 1200. As can be seen, the shape of the inner spacer 1200 may be concave as shown in FIG. 15A. Alternatively, the shape of the inner spacer 1200 may be convex as shown in FIG. 15B. Shapes other than convex or concave are contemplated.

Figure 16:
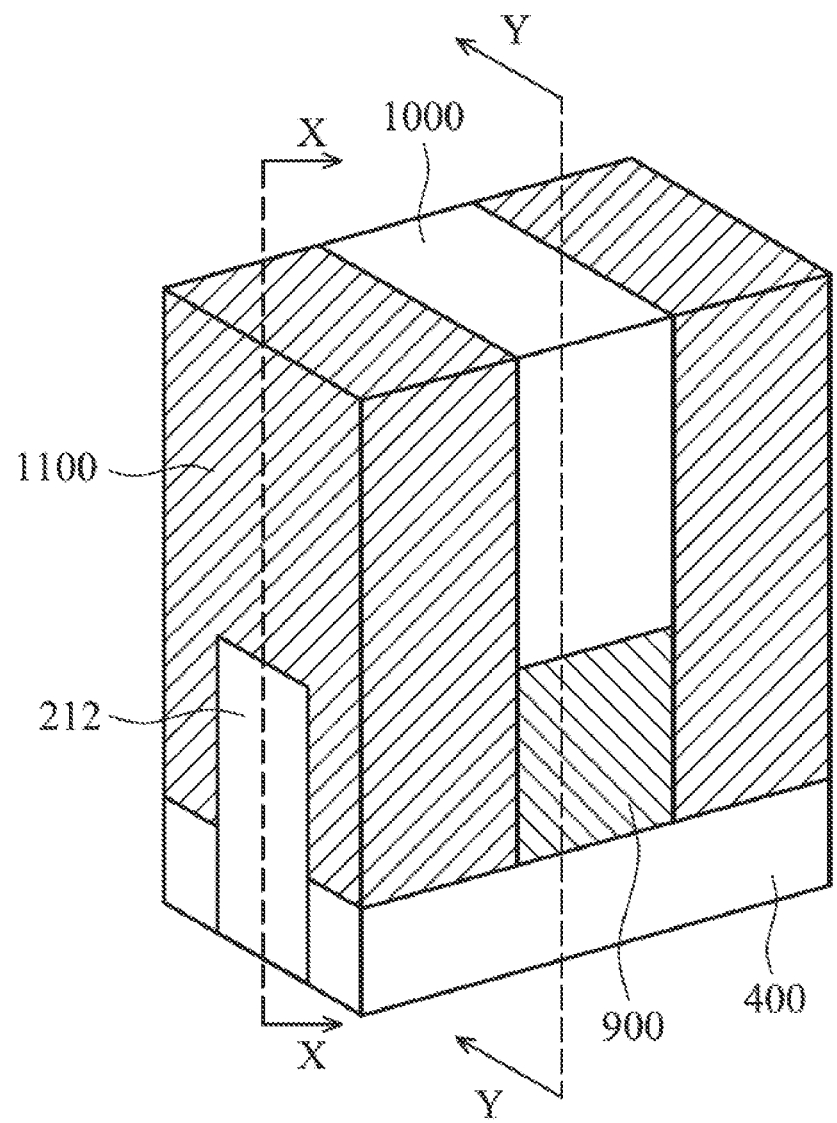
FIG. 16 is a perspective view of a semiconductor device in accordance with some embodiments, where the device may be a FinFET.

FIG. 16 illustrates a perspective view of the semiconductor device 200 according to some embodiments, where the device may be a FinFET. The semiconductor device 200 includes fin 212 extending above the substrate and through isolation regions (STI) 400. The active gates 1100 are formed on the fins 212 which act as channels between the S/D structures 900. The ILD 1000 is disposed above the S/D structures 900 and adjacent the active gates 1100.

Figure 17:
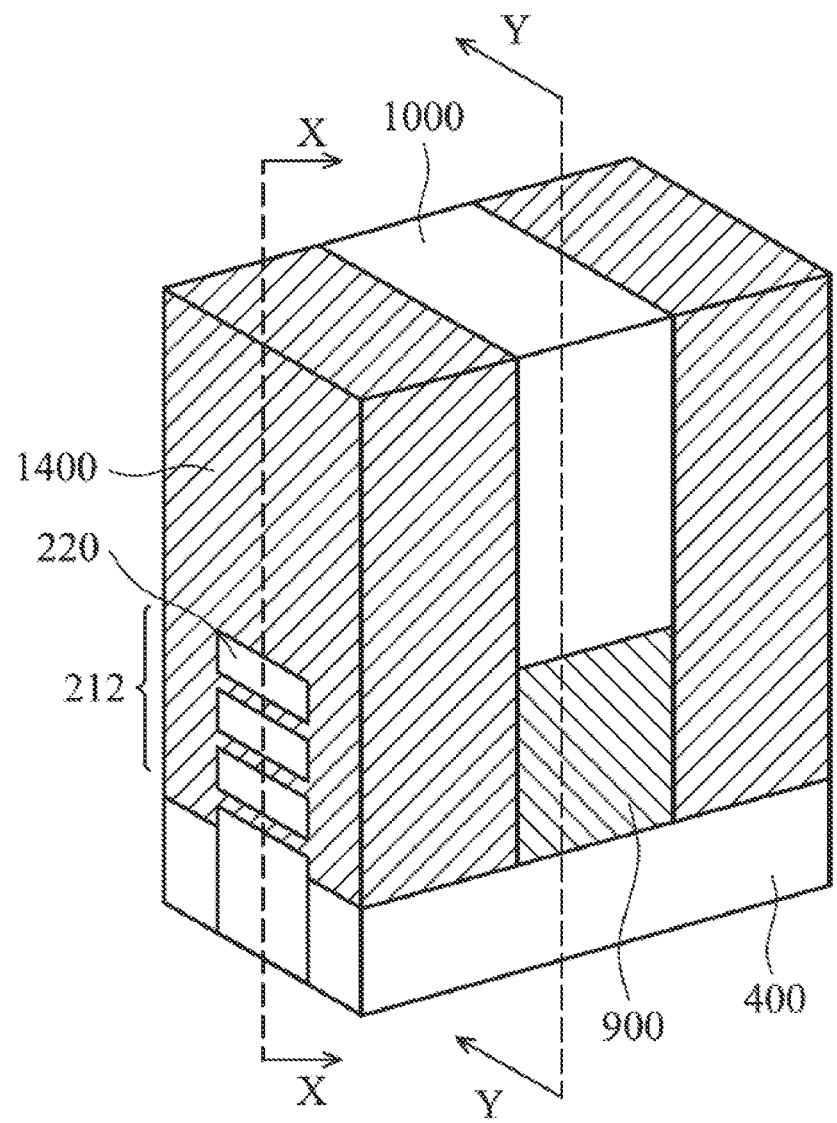
FIG. 17 is a perspective view of a semiconductor device in accordance with some embodiments, where the device may be a GAAFET.

FIG. 17 illustrates a perspective view of the semiconductor device 200 according to some embodiments, where the device may be a GAAFET. The semiconductor device 200 includes fin 212 extending above the substrate and through isolation regions (STI) 400. The active gates 1400 are formed between the second semiconductor layers 220 which act as channels between the S/D structures 900. The ILD 1000 is disposed above the S/D structures 900 and adjacent the active gates 1400.

In one aspect of the present disclosure, a method of fabricating a semiconductor device is disclosed. A plurality of fins is formed over a substrate. Dummy gates are formed patterned over the fins, each dummy gate having a spacer on sidewalls of the patterned dummy gates. Recesses are formed in the fins using the patterned dummy gates as a mask. A passivation layer is formed over the fins and in the recesses in the fins. The passivation layer is patterned to leave a remaining passivation only in some of the recesses in the fins. Source and drain regions are epitaxially formed only in the recesses in the fins without the remaining passivation.

In another aspect of the present disclosure, a semiconductor device is disclosed. The semiconductor device includes a substrate. A plurality of fins are disposed over the substrate. A plurality of recesses are disposed in each of the fins. A passivation layer is disposed only in some of the recesses. Source and drain regions are disposed only in the recesses not having the passivation disposed therein.

In another aspect of the present disclosure, a semiconductor device is disclosed. The semiconductor device includes a substrate. A plurality of fins are disposed over the substrate, each of the fins including a plurality of semiconductor sub-layers. A plurality of recesses are disposed in each of the fins. A passivation layer is disposed only in some of the recesses. Inner spacers are laterally adjacent conductive gate material on sidewalls of the recesses in the fins. The inner spacers are not disposed in the recesses in the fins having the passivation layer disposed therein.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    forming a plurality of fins over a substrate;
    forming dummy gates patterned over the fins, each dummy gate having a spacer on sidewalls of the patterned dummy gates;
    forming recesses in the fins by using the patterned dummy gates as a mask;
    forming a passivation layer over the fins and in the recesses in the fins;
    patterning the passivation layer to leave a remaining passivation layer in some of the recesses in the fins; and
    epitaxially forming source and drain regions in the recesses in the fins without the remaining passivation layer.

2. The method of claim 1, wherein patterning the passivation layer comprises:
    forming a patterned resist layer over the fins; and
    etching the passivation layer using the patterned resist layer as an etch mask.

3. The method of claim 1, further comprising:
    forming an interlayer dielectric layer over the remaining passivation layer and the source and drain regions.

4. The method of claim 3, further comprising:
    removing the dummy gates; and
    replacing the dummy gates with conducting gates.

5. The method of claim 3, wherein the remaining passivation layer is formed on sidewalls of the recesses in the fins, and the interlayer dielectric is formed on the remaining passivation layer in the recesses in the fins.

6. The method of claim 1, wherein each of the fins comprises alternating semiconductor sub-layers and sacrificial layers, the method further comprising:
    removing the sacrificial layers and leaving the semiconductor sub-layers.

7. The method of claim 6, further comprising:
    forming inner spacers laterally adjacent the sacrificial layers on sidewalls of the recesses in the fins.

8. The method of claim 7, wherein the inner spacers are formed prior to forming the passivation layer.

9. The method of claim 1, wherein the passivation layer is resistant to epitaxial growth on a material of the source and drain regions.

10. The method of claim 1, wherein the passivation layer comprises a material selected from the group consisting of SiN, SiON, SiCN, SiOCN, $SiO_2$, SiC, HfO, $Al_2O_3$, Co, W, and combinations thereof.

11. A semiconductor device, comprising:
    a substrate;
    a plurality of fins disposed over the substrate;
    a plurality of recesses disposed in each of the fins;
    a passivation layer disposed in some of the recesses; and
    source and drain regions disposed in the recesses not having the passivation layer disposed therein.

12. The semiconductor device of claim 11, wherein the passivation layer comprises a material selected from the group consisting of SiN, SiON, SiCN, SiOCN, $SiO_2$, SiC, HfO, $Al_2O_3$, Co, W, and combinations thereof.

13. The semiconductor device of claim 11, wherein each of the fins comprises a plurality of semiconductor sub-layers.

14. The semiconductor device of claim 13, further comprising:
    inner spacers laterally adjacent conductive gate material on sidewalls of the recesses in the fins.

15. The semiconductor device of claim 14, wherein the conductive gate material between the inner spacers has one of a concave cross-section or a convex cross-section.

16. The semiconductor device of claim 14, wherein the inner spacers are not disposed in the recesses in the fins having the passivation layer disposed therein.

17. The semiconductor device of claim 11, wherein the passivation layer is formed on sidewalls of the recesses in the fins with a passivation thickness of about 0.3 nm to 30 nm.

18. The semiconductor device of claim 11, wherein the passivation layer is formed in a recess at the top of the fins with a depth in the recess of about 0.3 nm to 20 nm.

19. The semiconductor device of claim 11, wherein the passivation layer is formed in a recess at the top of the fins with a thickness outside of the recess of about 0.3 nm to 30 nm.

20. A semiconductor device, comprising:
    a substrate;
    a plurality of fins disposed over the substrate, each of the fins comprising a plurality of semiconductor sub-layers;

a plurality of recesses disposed in each of the fins;
a passivation layer disposed in some of the recesses; and
inner spacers laterally adjacent conductive gate material on sidewalls of the recesses in the fins, wherein the inner spacers are not disposed in the recesses in the fins having the passivation layer disposed therein.

* * * * *